(12) United States Patent
Bahlmann et al.

(10) Patent No.: US 11,006,545 B2
(45) Date of Patent: May 11, 2021

(54) TEXTILE MACHINE COMPRISING A COOLING ARRANGEMENT

(71) Applicant: Maschinenfabrik Rieter AG, Winterthur (CH)

(72) Inventors: Bernd Bahlmann, Schrobenhausen (DE); Mario Maleck, Walting (DE); Philipp Renner, Grossmehring (DE); Stefan Sippl, Ingolstadt (DE)

(73) Assignee: Maschinenfabrik Rieter AG, Winterthur (CH)

( * ) Notice: Subject to any disclaimer, the term of this patent is extended or adjusted under 35 U.S.C. 154(b) by 172 days.

(21) Appl. No.: 16/422,159

(22) Filed: May 24, 2019

(65) Prior Publication Data

US 2019/0364690 A1 Nov. 28, 2019

(30) Foreign Application Priority Data

May 25, 2018 (DE) .................... 10 2018 112 620.4

(51) Int. Cl.
G06F 1/16 (2006.01)
H05K 5/00 (2006.01)
H05K 7/00 (2006.01)
H05K 7/20 (2006.01)
D01H 4/14 (2006.01)
D01H 1/16 (2006.01)

(52) U.S. Cl.
CPC ............... H05K 7/202 (2013.01); D01H 4/14 (2013.01); H05K 7/20 (2013.01); D01H 1/16 (2013.01)

(58) Field of Classification Search
CPC ............ G06F 1/20; G06F 1/203; G06F 1/206; H05K 7/202; H05K 7/20; H05K 7/20009; H05K 7/20136; H05K 7/20127; D01H 4/14

See application file for complete search history.

(56) References Cited

FOREIGN PATENT DOCUMENTS

| DE | 31 13 909 A1 | 9/1982 |
| DE | 35 17 149 A1 | 11/1986 |
| DE | 10 2007 015 826 A1 | 10/2008 |
| EP | 0 326 688 | 8/1989 |
| WO | WO 2016/189480 A1 | 12/2016 |

OTHER PUBLICATIONS

German Patent Office Search Report, dated Jan. 31, 2019.

*Primary Examiner* — Anthony M Haughton
(74) *Attorney, Agent, or Firm* — Dority & Manning, P.A.

(57) ABSTRACT

A textile machine includes a plurality of workstations adjacently situated in a longitudinal direction of the textile machine, the workstations combined to form multiple sections wherein each section includes one or more of the workstations. A plurality of electrical supply units supply electrical energy to the workstations, wherein one of the electrical supply units is assigned to each section or to each workstation. A cooling arrangement includes at least one coolant circuit configured with the electrical supply units such that waste heat generated by one or more of the electrical supply units is absorbed by a coolant within the coolant circuit and transported to a common discharge area of the textile machine.

16 Claims, 2 Drawing Sheets

TEXTILE MACHINE COMPRISING A COOLING ARRANGEMENT

FIELD OF THE INVENTION

Figure 1:
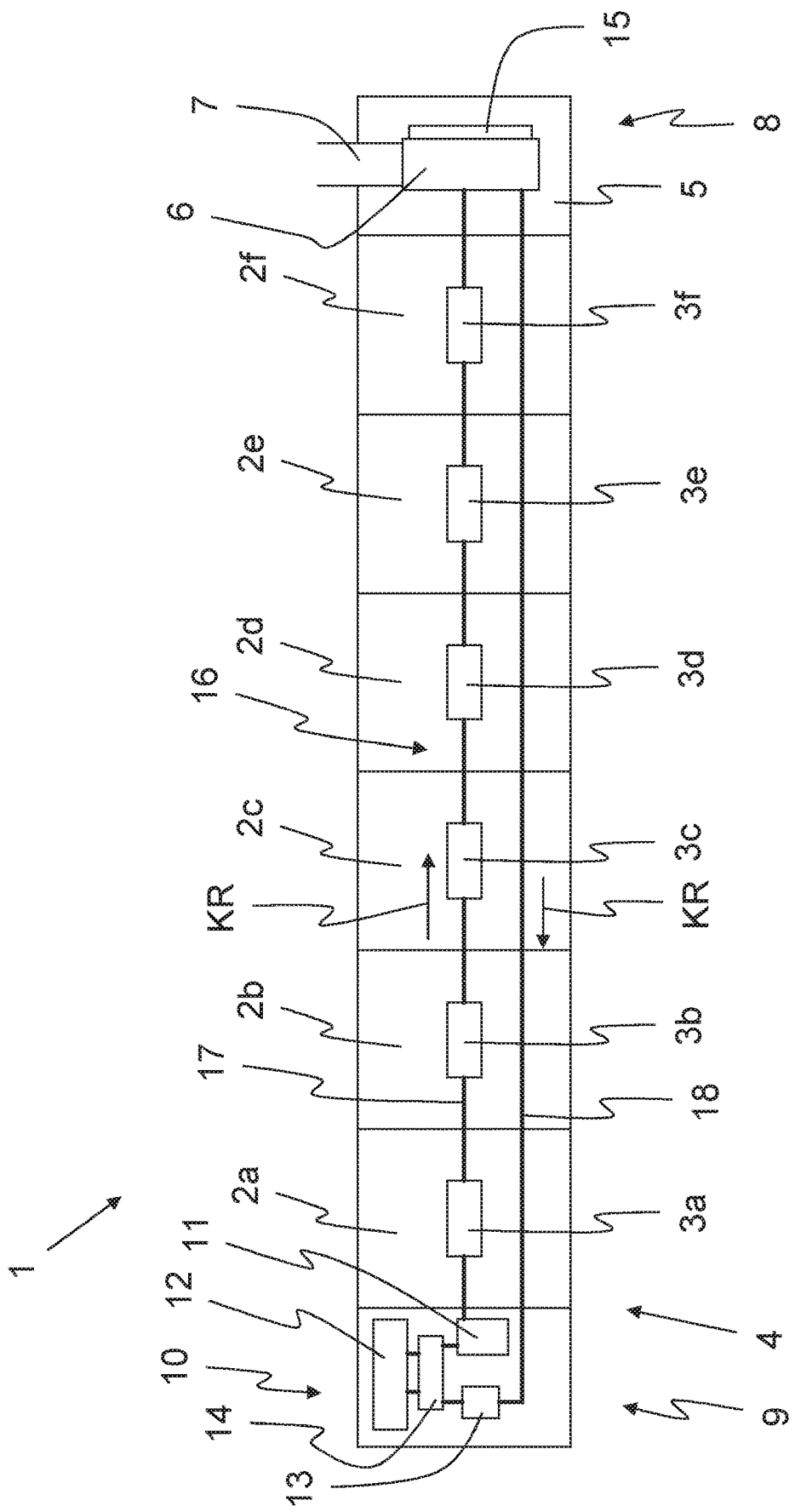

The present invention relates to a textile machine having a plurality of adjacently situated workstations, in particular, spinning and/or winding positions, which are combined to form multiple sections. The textile machine includes multiple electrical supply units, with the aid of which the workstations and/or sections can be supplied with electrical energy. The textile machine includes at least one cooling arrangement, with the aid of which waste heat of the electrical supply units can be absorbed and transported to a discharge area of the textile machine.

BACKGROUND

EP 0 326 688 B1 describes a textile machine in which the spindles, the motors, and their power supplies are cooled with the aid of multiple cooling circuits. The cooling circuits transport the waste heat into a suction channel, which extends along the textile machine and is present anyway, where the heat is given off to the air flowing there.

SUMMARY

A problem addressed by the present invention is that of improving the cooling of the textile machine. Additional objects and advantages of the invention will be set forth in part in the following description, or may be obvious from the description, or may be learned through practice of the invention.

The problems are solved by a textile machine having the features described and claimed herein.

The invention relates to a textile machine, in particular a rotor spinning machine, comprising a plurality of workstations adjacently situated in a longitudinal direction of the textile machine, wherein the workstations can be spinning and/or winding positions that are combined to form multiple sections. The productivity of the textile machine can be increased in accordance with the number of workstations. If the workstations are spinning positions, for example, a yarn can be produced with the aid thereof.

Moreover, the textile machine comprises multiple electrical supply units for providing electrical energy. The workstations and/or the sections can be supplied with electrical energy with the aid of the electrical supply units. One electrical supply unit can be associated with each workstation in this case. Additionally or alternatively, an electrical supply unit can also supply electrical energy to a section made up of multiple workstations.

Since an electrical supply unit always has a power loss, which is converted into waste heat, the textile machine comprises a cooling arrangement including at least one coolant circuit, with the aid of which the waste heat of the electrical supply units can be absorbed and transported to a discharge area of the textile machine.

As a result, the electrical supply units are cooled or held at a constant temperature, so that the electrical supply units are protected against damage due to overheating.

According to the invention, the cooling arrangement is designed in such a way that the waste heat of several of the electrical supply units can be transported to a common discharge area of the textile machine with the aid of the at least one coolant circuit. Water, for example, can circulate in the coolant circuit as the coolant, which absorbs the waste heat of the electrical supply units and carries it away. As a result, the waste heat can be collected in the discharge area and, from there, can be given off to the surroundings.

The discharge area is advantageously situated within the textile machine, preferably at one of the two ends of the textile machine. Additionally or alternatively, it is also possible, however, to provide the discharge area or a further discharge area outside the textile machine. For example, the textile machine could also comprise a port, with the aid of which a coolant circulating in the coolant circuit can be conducted out of the textile machine. It can also be advantageous to conduct the coolant out of a hall in which the textile machine is situated, in order to recool the coolant outside the hall. For example, the coolant could also be conducted up to a roof of a building in which the textile machine is situated, in order to give off the heat there. Since the rooms in which such textile machines are situated are mostly air-conditioned, an excessive loading of the air conditioning system can be avoided by utilizing a discharge area outside the building. It would also be conceivable to conduct the coolant loaded with the waste heat to a heating system of the building. The discharge area is located outside the machine in this case as well.

In an advantageous enhanced embodiment of the invention, a heat exchanger of the cooling arrangement is situated in the discharge area, with the aid of which the waste heat can be given off to surroundings of the textile machine. The heat exchanger can be designed, for example, as a radiator, so that the heat can be given off to the surrounding air. Moreover, the transfer of the waste heat to the surrounding air can be assisted by a fan.

When the textile machine has a certain length, it can be advantageous when the textile machine comprises at least two discharge areas, so that the waste heat only needs to be transported across short distances to the discharge area. The discharge areas can be spaced apart, for example, along the textile machine.

Therefore, it is also advantageous when a discharge channel is situated in the discharge area. The waste heat can be discharged from the textile machine with the aid of the discharge channel without being given off to the surroundings and, therefore, heating up the surroundings. If the textile machine is situated, for example, in an air-conditioned hall, the heat release into the hall is avoided by conducting the waste heat away with the aid of the discharge channel and, as a result, the air conditioning system is loaded to a lesser extent or can be designed having smaller dimensions. The discharge channel can conduct the waste heat away, for example, with the aid of an air flow.

It is also conceivable, however, that an external cooling system, i.e., a cooling system situated outside the textile machine, is associated with the textile machine, and the waste heat in the discharge area can be transferred to the external cooling system. The discharge channel is part of the external cooling system in this case. The external cooling system can be likewise designed as a coolant circuit in this case.

The at least one discharge area comprising a heat exchanger can be situated both within the textile machine and outside the textile machine. Advantageously, multiple textile machines and, if necessary, other heat-generating systems can also be connected to the external cooling system.

The electrical supply units preferably contain power supply units, frequency inverters, and/or any other types of electrical components, which are required for providing electrical energy to the workstations and/or the sections.

According to an advantageous embodiment, each of the sections comprises an electrical supply unit, in particular, a power supply unit, for supplying energy to the particular section and to the workstations associated therewith. In this case, the electrical supply unit has an appropriately high power output, of course, in order to be able to supply, for example, 20 workstations of a section with electrical energy. The electrical supply unit can therefore have a power output of a few kilowatts, and so the described cooling arrangement is particularly advantageous for such an embodiment.

Advantageously, the at least one coolant circuit connects all electrical supply units of the textile machine, and their waste heat can be transported to a single, common discharge area. As a result, the waste heat of the electrical supply units can be absorbed in every single section and transported to the central discharge area. A heating of parts of the textile machine is avoided as a result.

Additionally or alternatively, it is advantageous when the discharge area is situated on a first end of the textile machine, in particular, in a first foot end. As a result, an adverse effect on the textile machine with respect to space, due to the discharge area, for example, due to the heat exchanger or the like, can be avoided. In addition, the waste heat can be given off there without heating up surrounding workstations, as would be the case, for example, if the discharge area were situated between two workstations.

In particular, in the case of a longer textile machine, it can also be advantageous, however, when the textile machine comprises at least two discharge areas, wherein preferably a discharge area is situated on the first end of the textile machine, in particular in a first foot end of the textile machine, and a discharge area is situated on a second end of the textile machine, in particular in a second foot end of the textile machine. In this case, it is also advantageous when at least two coolant circuits are also provided on the textile machine. For example, the workstations on one longitudinal side of the machine can be connected to the first coolant circuit, and the workstations on the second longitudinal side of the machine can be connected to the second coolant circuit. It is also conceivable, however, to subdivide the two longitudinal sides of the machine into two halves each, and to connect the workstations of the first half on both longitudinal sides of the machine to the first coolant circuit and connect the workstations of the second half on both longitudinal sides of the machine to the second coolant circuit.

It is also advantageous when the cooling arrangement comprises an operating unit. The operating unit can encompass all elements required for operating the cooling arrangement. The operating unit can encompass, for example, a control unit for controlling the cooling arrangement, a pump, a coolant reservoir, an air venting unit, and/or control valves. The operating unit is preferably situated on the second end of the textile machine, which is positioned opposite the discharge area, in particular in a second foot end of the textile machine. Therefore, the operating unit and the discharge area are connected by the at least one coolant circuit. The coolant can be pumped, for example, by the pump of the operating unit through the coolant circuit and, therefore, to the electrical supply units, so that the waste heat is absorbed and transported to the discharge area. As a result, the components of the cooling arrangement can be accommodated in a manner, which is particularly space-saving and effective with respect to the cooling capacity.

According to an enhanced embodiment of the invention, the sections and/or the workstations comprise further sources of waste heat, which are connected to the at least one coolant circuit. For example, large drives of the textile machine, such as central drives for certain functional units, can be connected to the coolant circuit in this way. Therefore, the waste heat, for example, of drives of the workstations, in particular of the rotor drives, can also be effectively carried away with the aid of the at least one coolant circuit. Likewise, electronic components, for example, control units or power supply units, at the individual workstations can be connected to the coolant circuit in order to extend the service life of the electronic components.

It is advantageous when the cooling arrangement comprises multiple coolant circuits, wherein the electrical supply units and/or the further sources of waste heat are connected to the multiple coolant circuits in such a way that an absorption of waste heat of the multiple coolant circuits is the same in each case. As a result, the electrical supply units are distributed evenly onto the existing coolant circuits, so that each coolant circuit essentially absorbs and carries away the same amount of waste heat. As a result, the situation is avoided in which one coolant circuit absorbs and carries away considerably more waste heat as compared to the other coolant circuits. The power supply units can therefore be uniformly cooled despite their different arrangement within the machine.

It is also advantageous when the cooling arrangement comprises multiple coolant circuits having the number N, wherein the waste heat of the 1st, the N+1nth, the 2N+1nth, the 3N+1nth, etc., electrical supply unit can be absorbed with the aid of the first coolant circuit, the waste heat of the 2nd, the N+2nth, the 2N+2nth, the 3N+2nth, etc., electrical supply unit can be absorbed with the aid of the second coolant circuit, the waste heat of the 3rd, the N+3nth, the 2N+3nth, the 3N+3nth, etc., electrical supply unit can be absorbed with the aid of the third coolant circuit, etc.

If the cooling arrangement comprises, for example, three coolant circuits, the waste heat of the first, the fourth, the seventh, the tenth, etc., electrical supply unit can be absorbed with the aid of the first coolant circuit. The waste heat of the second, the fifth, the eighth, the eleventh, etc., electrical supply unit can be absorbed with the aid of the second coolant circuit. The waste heat of the third, the sixth, the ninth, the twelfth, etc., electrical supply unit can be absorbed with the aid of the third coolant circuit. As a result, the electrical supply units of the textile machine can be uniformly cooled with the aid of multiple coolant circuits.

Moreover, it is advantageous when the coolant circuits comprise multiple supply lines and one common return line. As a result, the cooling arrangement can be more simply designed.

It is advantageous when the supply line(s) and/or the return line extend or extends along the longitudinal direction of the textile machine. As a result, the coolant can flow through the power supply units one after the other.

Moreover, it is advantageous when the electrical supply units each comprise a cooling unit which is preferably integrated into a housing of the supply units, wherein the at least one coolant circuit, in particular the supply line of the at least one coolant circuit, extends through the cooling unit. The cooling unit can be, for example, a radiator in the form of a metal plate and/or a metal block, which is situated in and/or on the electrical supply units and absorbs the waste heat and transfers it to the coolant of the coolant circuit. Preferably, the radiator forms a housing wall of the power supply unit.

Preferably, the cooling unit comprises one or more meandering cooling channels, so that the coolant circuit is routed through the cooling unit in a meandering manner. The coolant is therefore in contact with the cooling unit for a longer time and, as a result, can absorb more waste heat. Such an embodiment is advantageous, in particular, in the case of power supply units, which supply power to the entire section including its workstations and, therefore, have a particularly high power output.

DETAILED DESCRIPTION

Figure 2:
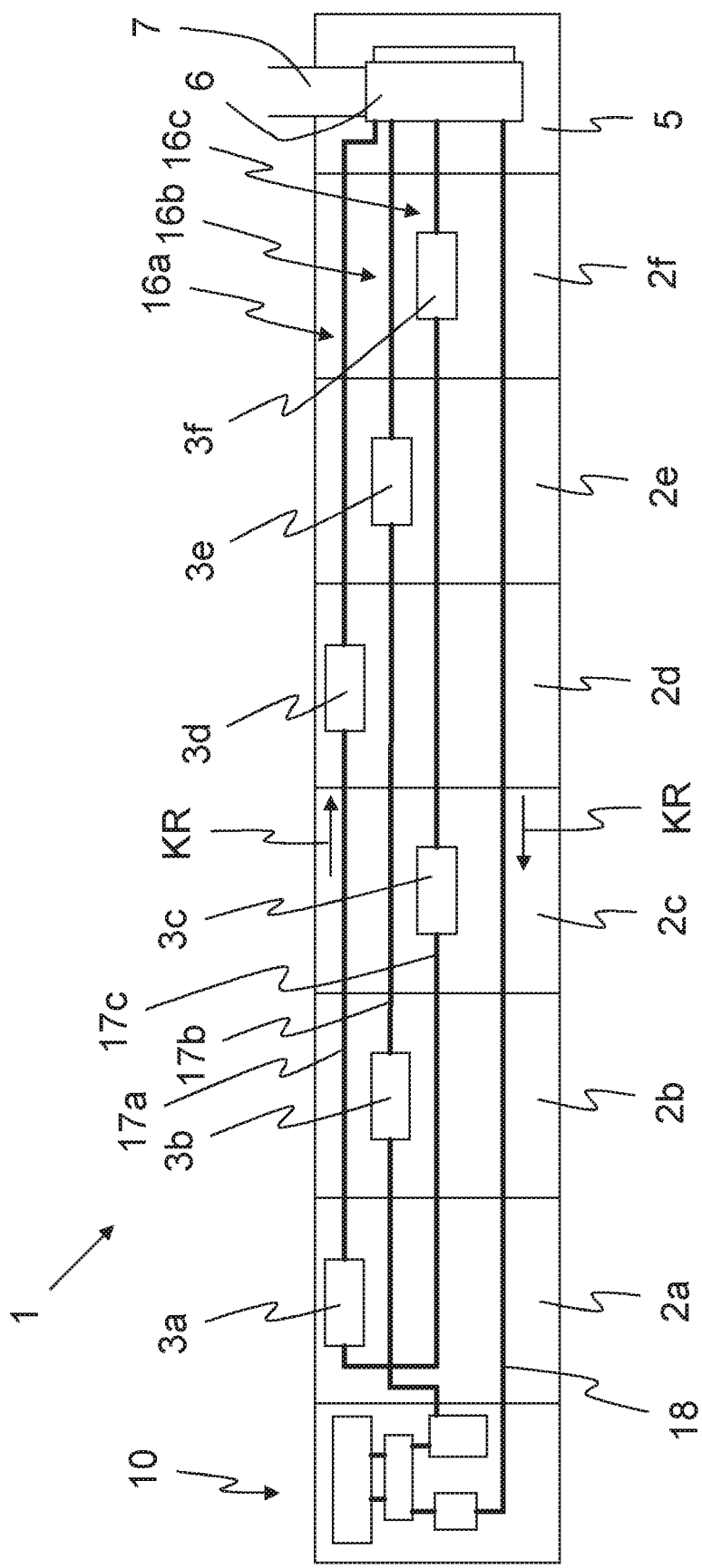

Further advantages of the invention are described in the following exemplary embodiments. Wherein:

FIG. 1 shows a schematic view of a textile machine comprising a cooling arrangement for electrical supply units including one coolant circuit, and FIG. 2 shows a schematic view of a textile machine comprising a cooling arrangement for electrical supply units including multiple coolant circuits.

DETAILED DESCRIPTION

Reference will now be made to embodiments of the invention, one or more examples of which are shown in the drawings. Each embodiment is provided by way of explanation of the invention, and not as a limitation of the invention. For example features illustrated or described as part of one embodiment can be combined with another embodiment to yield still another embodiment. It is intended that the present invention include these and other modifications and variations to the embodiments described herein.

FIG. 1 shows a schematic view of a textile machine 1 comprising a cooling arrangement 4 for electrical supply units 3a-3f. The textile machine 1 encompasses a plurality of workstations, so that productivity of the textile machine 1 is increased in accordance with the number of workstations. The workstations may be spinning and/or winding positions, which manufacture or handle a yarn. In the present exemplary embodiment, the workstations have been combined to form sections 2a-2f, wherein one section 2a-2f can encompass, for example, 20 workstations. The textile machine 1 of the present exemplary embodiment comprises, by way of example, six sections 2a-2f, each of which includes an electrical supply unit 3a-3f. Textile machines 1 comprising more sections 2a-2f and/or electrical supply units 3a-3f are also conceivable, of course.

According to the present exemplary embodiment, an electrical supply unit 3a-3f is associated with each section 2a-2f in order to be able to supply the section 2a-2f with electrical energy. Additionally or alternatively, it would also be conceivable that an electrical supply unit 3a-3f is also associated with a single workstation. The electrical supply unit 3a-3f can be, for example, a power supply unit, a frequency inverter, a load electronics unit, or the like, which are required for providing the electrical energy.

Since, according to the present exemplary embodiment, an electrical supply unit 3a-3f must supply electrical energy to a section 2a-2f encompassing, for example, 20 workstations, the electrical supply unit 3a-3f has an appropriately high electrical power output, which can be, for example, in the range of up to 10 kilowatts. Since each electrical supply unit 3a-3f has a power loss, which can amount to 500 watts or more, a portion of the energy fed to the electrical supply unit 3a-3f is converted into waste heat, which results in the heating up of the electrical supply units 3a-3f, the sections 2a-2f, and the textile machine 1.

In order to avoid an overheating, in particular, of the electrical supply units 3a-3f, the textile machine 1 comprises the cooling arrangement 4, with the aid of which the waste heat of the electrical supply units 3a-3f can be transported to a discharge area 5 of the textile machine 1. In particular, with the aid of the cooling arrangement 4, all the waste heat generated by the electrical supply units 3a-3f can be transported to the discharge area 5. For example, the waste heat of all electrical supply units 3a-3f can be transported to the discharge area 5. There, the collected waste heat can be discharged from the textile machine 1 and given off to the surroundings.

According to the present exemplary embodiment, the discharge area 5 is situated on a first end 8 of the textile machine 1. As a result, a heating up of the sections 2a-2f (section 2f in this case) adjacent to the discharge area 5 can be reduced to a minimum.

In the discharge area 5, the cooling arrangement 4 comprises a heat exchanger 6, which transfers the waste heat from the cooling arrangement 4 to the surroundings. According to the present exemplary embodiment, the heat exchanger 6 is adjoined by a discharge channel 7, with the aid of which the waste heat can be discharged, for example, from a building in which the textile machine 1 is located. Moreover, a fan 15 can be situated on the heat exchanger 6 in order to assist the heat exchange with the surroundings and, if necessary, to be able to transfer the waste heat into the discharge channel 7 in a targeted manner.

Moreover, the cooling arrangement 4 comprises an operating unit 10, which encompasses the elements required for the operation of the cooling arrangement 4. The operating unit 10 can encompass, for example, a pump 11 for pumping a coolant, a coolant reservoir 12, control valves 13, and/or an air separator 14. Advantageously, it is possible with the aid of the operating unit 10 to completely drain the cooling arrangement 4 in order, for example, to replace the coolant or even individual electrical supply units 3a-3f.

According to the present exemplary embodiment, the operating unit 10 is situated on a second end 9 of the textile machine 1, which is positioned opposite the first end 8.

In order to be able to transport the waste heat, the cooling arrangement 4 also comprises at least one coolant circuit 16. With the aid of the coolant circuit 16, a coolant can be transported to the electrical supply units 3a-3f, where the coolant absorbs the waste heat. The coolant can be transported from the electrical supply units 3a-3f to the discharge area 5, where the coolant gives off the waste heat to the surroundings. The coolant itself can heat up during the absorption of the waste heat at the electrical supply units 3a-3f.

Advantageously, the coolant can be water, since water is easy to handle and has a high heat capacity. Alternatively, a gas can also be utilized as a coolant. Additionally or alternatively, a coolant can also be utilized, which absorbs the waste heat as latent heat and carries it away.

According to the present exemplary embodiment, the coolant has a flow direction KR in the coolant circuit 16. The coolant therefore moves from the operating unit 10 to the electrical supply units 3a-3f, to the discharge area 5, and back to the operating unit 10, and so the circulation of the coolant is closed. The coolant is therefore transported from the second end 9 of the textile machine 1 to the first end 8 of the textile machine 1 and back to the second end 9 of the textile machine 1.

Due to the flow direction KR, a transport direction of the waste heat is likewise formed. The waste heat is conveyed from the multiple heat absorption points, which are adjacently situated along the longitudinal direction of the textile machine 1 and, in the present case, are formed by the electrical supply units 3a-3f in each case, up to the first end 8 of the textile machine 1.

According to the present exemplary embodiment, the coolant circuit 16 comprises a supply line 17, which extends from the operating unit 10 to the electrical supply units 3a-3f. The supply line 17 conveys the coolant to the electrical supply units 3a-3f one after the other and therefore absorbs the waste heat from each electrical supply unit 3a-3f in sequential order. The coolant can heat up from electrical supply unit 3a-3f to electrical supply unit 3a-3f, wherein the coolant absorbs a certain amount of heat at each electrical supply unit 3a-3f and, therefore, increases by a certain temperature difference in each case.

In the flow direction KR after the last electrical supply unit 3a-3f, the coolant is conveyed to the discharge area 5, where the coolant gives off the waste heat. This can take place, for example, with the aid of the heat exchanger 6, shown here, and, if necessary, with the aid of the fan 15. The waste heat can be discharged to the discharge channel 7, which conveys the waste heat, for example, out of the building of the textile machine.

After the coolant has given off the waste heat in the discharge area 5, wherein the coolant may have cooled down, the coolant can be conveyed in a return line 18 back to the operating unit 10. It is advantageous that the return line 18 can also be utilized for discharging heat to the surroundings, due to the length of the return line 18, which preferably extends along all workstations of the textile machine. This also applies, of course, for the following exemplary embodiment.

FIG. 2 shows a schematic view of a textile machine 1 comprising a cooling arrangement 4 for electrical supply units 3a-3f, including multiple coolant circuits 16a-16c. For the sake of simplicity, only the relevant features and/or features, which are new as compared to FIG. 1 are provided with a reference sign in this case and are described in greater detail in the following.

The textile machine 1 of the present exemplary embodiment comprises three coolant circuits 16a-16c which can absorb the waste heat of the electrical supply units 3a-3f and carry or transport it away. The coolant circuits 16a-16c are situated in such a way, or remove the waste heat of those electrical supply unit 3a-3f in such a way that a first coolant circuit 16a removes the waste heat of the sections marked with the reference signs 2a and 2d in this exemplary embodiment, i.e., the waste heat of the energy supply units 3a and 3d. A second coolant circuit 16b removes the waste heat of the sections 2b and 2e or of the energy supply units 3b and 3e. A third coolant circuit 16c removes the waste heat of the sections 2c and 2f or of the energy supply units 3c and 3f.

The first coolant circuit 16a can therefore remove the waste heat of the first, the fourth, the seventh, the tenth, etc., (if there are more than the six electrical supply units 3a-3f shown here), as viewed from the operating unit 10.

The second coolant circuit 16b can therefore remove the waste heat of the second, the fifth, the eighth, the eleventh, etc., (if there are more than the six electrical supply units 3a-3f shown here), as viewed from the operating unit 10.

The third coolant circuit 16c can therefore remove the waste heat of the third, the sixth, the ninth, the twelfth, etc., (if there are more than the six electrical supply units 3a-3f shown here), as viewed from the operating unit 10.

Therefore, when there are N coolant circuits present, an nth coolant circuit 16 therefore removes the waste heat of the nth, the n+Nth, the n+2Nth, the n+3Nth, etc., electrical supply unit 3. As a result, the multiple coolant circuits 16 can uniformly remove the waste heat and the waste heat is uniformly distributed to the coolant circuits 16. The situation can therefore be prevented, for example, in which one coolant circuit 16 removes the most waste heat and the other coolant circuits 16 remove only a relatively small amount of waste heat.

According to the present exemplary embodiment, the three coolant circuits 16a-16c shown here comprise a supply line 17a-17c, respectively. The three coolant circuits 16a-16c comprise only one return line 18, however. The three supply lines 17a-17c are combined in the central heat exchanger 6 and, after the heat is discharged, are routed to the common return line 18.

The supply lines 17a-17c and the return line 18 can be advantageously situated below the workstations in the sections 2a-2f, in particular on or in a section distribution box, where they are easily accessible, for example, for maintenance work.

The present invention is not limited to the represented and described exemplary embodiments. Modifications within the scope of the claims are also possible, as is any combination of the features, even if they are represented and described in different exemplary embodiments.

LIST OF REFERENCE SIGNS 1 textile machine
2 section
3 electrical supply unit
4 cooling arrangement
5 discharge area
6 heat exchanger
7 discharge channel
8 first end
9 second end
10 operating unit
11 pump
12 coolant reservoir
13 control valves
14 air separator
15 fan
16 coolant circuit
17 supply line
18 return line
KR flow direction

The invention claimed is:

1. A textile machine, comprising:
a plurality of workstations adjacently situated in a longitudinal direction of the textile machine, the workstations combined to form multiple sections wherein each section includes one or more of the workstations;
a plurality of electrical supply units that supply electrical energy to any combination of: individual sections or one or more of the workstations within the individual sections, to individual workstations within the same or different sections, and to multiple sections or one or more of the workstations within the multiple sections;
a cooling arrangement comprising at least one coolant circuit configured with the electrical supply units such that waste heat generated by one or more of the electrical supply units is absorbed by a coolant within the coolant circuit and transported to a common discharge area of the textile machine.

2. The textile machine as in claim 1, wherein the cooling arrangement further comprises a heat exchanger situated in the common discharge area.

3. The textile machine as in claim 1, wherein the common discharge area is situated within the textile machine.

4. The textile machine as in claim 1, further comprising an external cooling system associated with the common discharge area, wherein the waste heat is transferred to the external cooling system at the common discharge area.

5. The textile machine as in claim 1, wherein the electrical supply units comprise one or both of power supply units or frequency inverters.

6. The textile machine as in claim 1, wherein one of the electrical supply units is assigned to each of the sections and supplies energy to a plurality of the workstations in the section.

7. The textile machine as in claim 1, wherein the coolant circuit comprises a single or a plurality of supply lines to the electrical supply units and a common return line from the electrical supply units to the common discharge area.

8. The textile machine as in claim 1, wherein common discharge area is disposed at a first foot end of the textile machine.

9. The textile machine as in claim 8, further comprising a second common discharge area disposed at a second foot end of the textile machine opposite from the first end of the textile machine.

10. The textile machine as in claim 8, wherein the cooling arrangement comprises an operating unit.

11. The textile machine as in claim 1, wherein the workstations or the sections comprise one or more additional sources of waste heat connected to the coolant circuit.

12. The textile machine as in claim 1, wherein the cooling arrangement comprises multiple coolant circuits, the electrical supply units connected to the multiple coolant circuits in a configuration such that absorption of waste heat is the same in each of the multiple coolant circuits.

13. The textile machine as in claim 12, wherein the multiple coolant circuits have the number N, wherein the waste heat of the 1st, the N+1nth, the 2N+1 nth, the 3N+1nth electrical supply units is absorbed by the first coolant circuit, the waste heat of the 2nd, the N+2nth, the 2N÷2nth, the 3N+2nth electrical supply units is absorbed by the second coolant circuit, and the waste heat of the 3rd, the N+3nth, the 2N+3nth, the 3N+3nth is absorbed by the third coolant circuit.

14. The textile machine as in claim 13, wherein the multiple coolant circuits comprise multiple supply lines and one common return line.

15. The textile machine as in claim 14, wherein the supply lines and the common return line extend along a longitudinal direction of the textile machine.

16. The textile machine as in claim 1, wherein the electrical supply units comprise a cooling unit integrated into a housing of the electrical supply unit, the coolant circuit supplying coolant through the cooling unit.

* * * * *